(12) United States Patent
Usher et al.

(10) Patent No.: US 9,264,828 B2
(45) Date of Patent: Feb. 16, 2016

(54) SOUND LEVEL DOSAGE SYSTEM FOR VEHICLES

(75) Inventors: John Usher, Devon (GB); Steven W. Goldstein, Delray Beach, FL (US)

(73) Assignee: Personics Holdings, LLC, Boca Raton, FL (US)

( * ) Notice: Subject to any disclaimer, the term of this patent is extended or adjusted under 35 U.S.C. 154(b) by 327 days.

(21) Appl. No.: 13/979,005

(22) PCT Filed: Jan. 12, 2012

(86) PCT No.: PCT/US2012/021078
§ 371 (c)(1),
(2), (4) Date: Sep. 23, 2013

(87) PCT Pub. No.: WO2012/097151
PCT Pub. Date: Jul. 19, 2012

(65) Prior Publication Data
US 2014/0010380 A1    Jan. 9, 2014

Related U.S. Application Data

(60) Provisional application No. 61/432,025, filed on Jan. 12, 2011.

(51) Int. Cl.
*H04R 29/00* (2006.01)
*H03G 3/30* (2006.01)
*H03G 3/32* (2006.01)

(52) U.S. Cl.
CPC ............. *H04R 29/00* (2013.01); *H03G 3/3005* (2013.01); *H03G 3/3089* (2013.01); *H03G 3/32* (2013.01)

(58) Field of Classification Search
CPC .... H05K 999/99; H04R 3/007; H04R 29/001; H04R 25/70; H04R 2499/13; H04R 31/006; H04R 5/02; H04R 2499/11; H04R 1/08; H04R 5/027; H04R 1/025; H04R 1/227; H04R 3/002; H04R 3/00; H04R 3/005; H04R 19/04; H04R 1/406; H04R 9/08; H04R 19/02; H04N 11/00; G10H 1/16; G10K 2210/1282; B60R 11/0217
USPC .......... 381/54–61, 71.4, 86–89, 91, 150, 302, 381/332–336, 365, 389, 26, 95, 111–117
See application file for complete search history.

(56) References Cited

U.S. PATENT DOCUMENTS

| 5,046,101 | A | 9/1991 | Lovejoy | |
| 2005/0195994 | A1* | 9/2005 | Saito et al. | ............ 381/102 |

(Continued)

FOREIGN PATENT DOCUMENTS

| JP | 60123200 | | 7/1985 |
| JP | 60123200 | A * | 7/1985 |

OTHER PUBLICATIONS

International Search Report for International Application No. PCT/US2012/021078, dated May 7, 2012.

(Continued)

*Primary Examiner* — Akelaw Teshale
(74) *Attorney, Agent, or Firm* — Pablo Meles

(57) ABSTRACT

Audio systems for a vehicle and methods of operating an audio device in a vehicle cabin are provided. A method of operating an audio device directs an acoustic signal to at least one vehicle cabin receiver (VCR) of the audio device; measures sound pressure levels ($SPL_{VCM}$) for acoustic energy received by at least one vehicle cabin microphone (VCM) of the audio device during a time period $\Delta t$; calculates a sound pressure level (SPL) dose ($SPL\_Dose_{\Delta t}$) during the time period $\Delta t$ using the sound pressure levels $SPL_{VCM}$ of the at least one VCM; combines the SPL dose ($SPL\_Dose_{\Delta t}$) with an SPL dose of a previous time period to form a total SPL dose ($SPL\_Dose_{total}$); and performs an action to modify operation of the audio device when the total SPL dose is greater than a predetermined threshold.

25 Claims, 8 Drawing Sheets

(56) References Cited

U.S. PATENT DOCUMENTS

| | | |
|---|---|---|
| 2005/0254665 A1 | 11/2005 | Vaudrey et al. |
| 2005/0254667 A1 | 11/2005 | Michael |
| 2006/0215846 A1* | 9/2006 | Kobayashi ............ G10K 15/02 381/61 |
| 2008/0025518 A1* | 1/2008 | Mizuno ................ H04S 3/002 381/17 |
| 2008/0137873 A1* | 6/2008 | Goldstein ............ H04R 1/1016 381/57 |
| 2008/0144841 A1 | 6/2008 | Goldstein et al. |
| 2009/0086990 A1* | 4/2009 | Christoph ............. H04R 3/04 381/71.12 |
| 2010/0091999 A1* | 4/2010 | Napoletano ............ H03G 7/002 381/57 |
| 2010/0135502 A1* | 6/2010 | Keady .................... A61B 5/121 381/58 |
| 2010/0221516 A1* | 9/2010 | Taniguchi ................ C08J 5/18 428/220 |
| 2010/0299107 A1* | 11/2010 | Umayahara ............ G01H 17/00 703/1 |

OTHER PUBLICATIONS

Written Opinion for International Application No. PCT/US2012/021078, dated May 7, 2012.

* cited by examiner

SOUND LEVEL DOSAGE SYSTEM FOR VEHICLES

CROSS REFERENCE TO RELATED APPLICATIONS

This application claims priority to PCT International Application No. PCT/US2012/021078 filed Jan. 12, 2012, entitled "SOUND LEVEL DOSAGE SYSTEM FOR VEHICLES" and claims the benefit of U.S. Provisional Application No. 61/432,025 entitled "SOUND LEVEL DOSAGE SYSTEM FOR VEHICLES" filed on Jan. 12, 2011, the contents of which are incorporated herein by reference.

FIELD OF THE INVENTION

The present invention relates to a device that monitors acoustic energy directed to a vehicle cabin, and more particularly, though not exclusively, to a vehicle audio system that monitors acoustic sound pressure level dose received by a vehicle operator.

BACKGROUND OF THE INVENTION

With the advent of an industrial society, people are exposed to noise pollution at greater and greater levels; both from background, such as street traffic, airplanes, construction sites and intentional exposure to high sound levels such as cell phones, MP3 players, and rock concerts. Studies show that hearing damage, leading to permanent hearing impairment is not only increasing in the general population, but increasing at a significantly faster rate in younger populations.

The potential for hearing damage is a function of both the level and the duration of exposure to the sound stimulus. Safe listening durations at various loudness levels are known, and can be calculated by averaging audio output levels over time to yield a time-weighted average. Standard damage-risk guidelines published by the Occupational Safety and Health Administration (OSHA), the National Institute for Occupational Safety and Health (NIOSH) or other agencies are known. This calculation can be even further improved by accounting for aspects of the playback scenario, specifically the characteristics of the sound source and their proximity to the listener's ear.

Studies have also indicated that hearing damage is a cumulative phenomenon. Although hearing damage due to industrial or background noise exposure is more thoroughly understood, the risk of exposing one's self to excessive noise, especially with the use of headphones has also been recently studied.

SUMMARY OF THE INVENTION

At least one exemplary is directed to a method of operating an audio device comprising: measuring sound pressure levels ($SPL_{VCM}$) for acoustic energy received within a vehicle cabin (measured with a vehicle cabin microphone (VCM)) during a time period $\Delta t$; and calculating a sound pressure level (SPL) dose ($SPL\_Dose_{\Delta t}$) during the time period $\Delta t$ using the sound pressure levels ($SPL_{VCM}$) of the VCM. Additional exemplary embodiments can combine the SPL dose ($SPL\_Dose_{\Delta t}$) with an SPL dose of a previous time period to form a total SPL dose ($SPL\_Dose_{total}$), and may calculate a remaining duration time, Time__100%, using the sound pressure levels $SPL_{VCM}$.

At least one exemplary embodiment can also compare the total SPL dose to a threshold value and, if the total SPL dose is greater than the threshold value, an action parameter may be read from readable memory (e.g., RAM). At least one further exemplary embodiment can perform an action associated with the value of the action parameter, where the action is at least one of modifying the operation of the audio device, modifying the acoustic signals directed to a vehicle cabin receiver (VCR) (i.e., a loudspeaker), and sending a notification signal to a user (in the foregoing, the "vehicle operator" is referred to as the "user").

In at least one exemplary embodiment the action of modifying the operation of the audio device includes at least one of the following: setting a time after which the audio device will shut down; or reducing the level of audio directed to the vehicle cabin (i.e. to the VCR).

In at least one exemplary embodiment the action of sending a notification signal to a user includes at least one of the following: sending an acoustic voice notification; sending an acoustic non-voice notification; activating at least one indicator light; activating a vibratory warning system; or sending a vibrotactile message to the vehicle operator.

At least one exemplary embodiment is directed to a method of operating a vehicle audio device comprising: measuring sound pressure levels ($SPL_{VCM}$) for an acoustic energy received by an vehicle cabin microphone (VCM) during the time increment $\Delta t$.

The vehicle System Transmission Loss (STL) can be determined using standard acoustic attenuation tests of insertion loss, and depending on the status of the vehicle, the total insertion loss (i.e., due to window design, gasketing, structural insulation, etc.) may be further modified. For instance, the degree to which each window is closed can be determined using the vehicle central control system (e.g. as a percentage, where 100% corresponds to the fully closed position for a given window, and 0% corresponds to the fully open position). From this "degree of closure" measure for each window, the vehicle attenuation could be modified using either a formula or a look-up (hash) table.

BRIEF DESCRIPTION OF THE DRAWINGS

The invention may be understood from the following detailed description when read in connection with the accompanying drawing. It is emphasized, according to common practice, that various features of the drawings may not be drawn to scale. On the contrary, the dimensions of the various features may be arbitrarily expanded or reduced for clarity. Moreover, in the drawing, common numerical references are used to represent like features. Included in the drawing are the following figures.

DETAILED DESCRIPTION OF THE INVENTION

Figure 1:
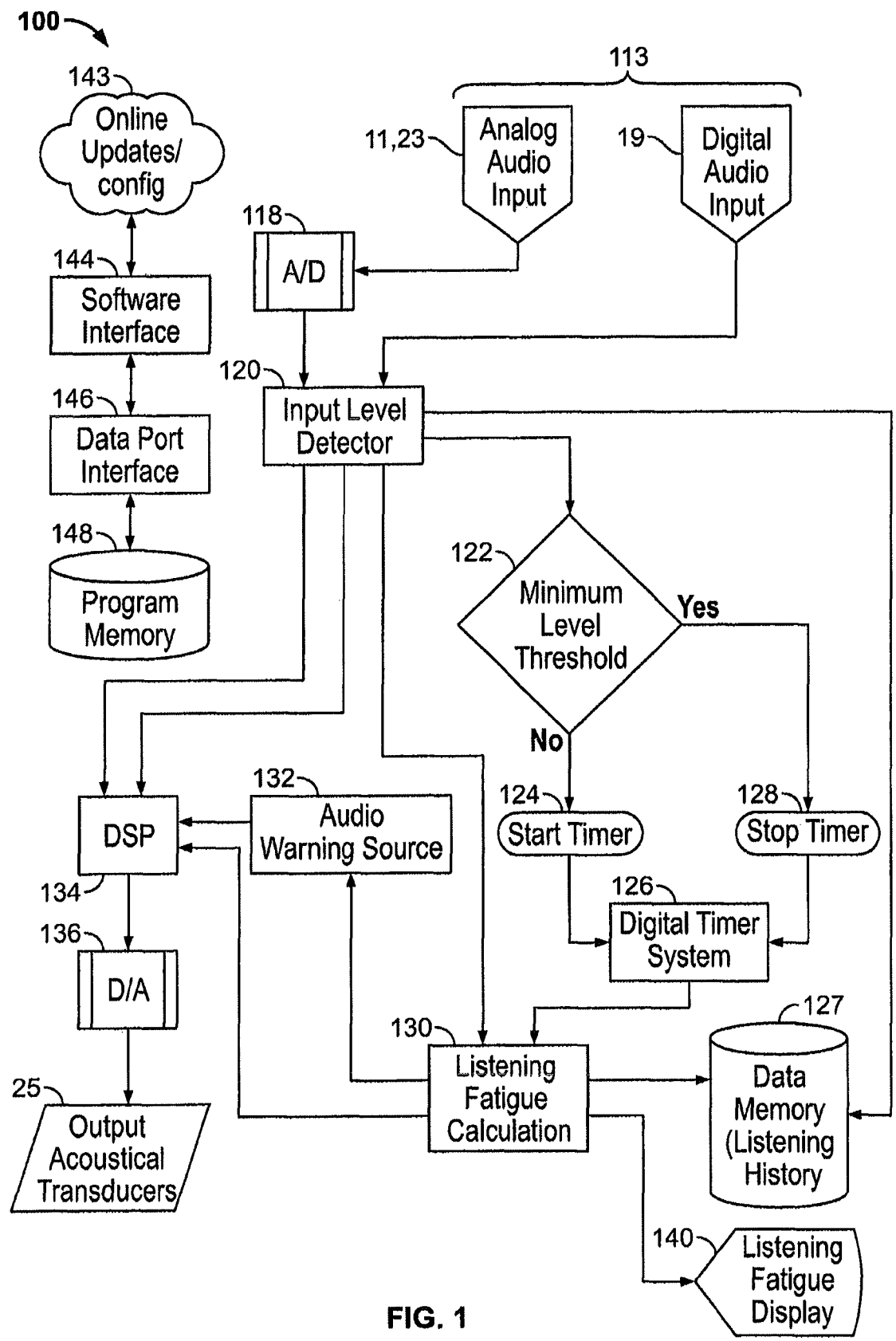
FIG. 1 is a block diagram of an exemplary system for measuring and determining exposure to sound over time in a vehicle cabin constructed in accordance with an embodiment of the invention.

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate, for example the fabrication and use of transducers. Additionally in at least one exemplary embodiment the sampling rate of the transducers can be varied to pick up pulses of sound, for example less than 50 milliseconds.

In all of the examples illustrated and discussed herein, any specific values, for example the sound pressure level change, should be interpreted to be illustrative only and non-limiting. Thus, other examples of the exemplary embodiments could have different values.

Note that similar reference numerals and letters refer to similar items in the following figures, and thus once an item is defined in one figure, it may not be discussed for following figures.

Note that herein when referring to correcting or preventing an error or damage (e.g., hearing damage), a reduction of the damage or error and/or a correction of the damage or error are intended.

It is known from the prior art to provide active noise reduction at the ear to protect the ear from exposure to loud noises as disclosed in U.S. patent Application No. US2005/0254665. The art actively attenuates noise reaching the inner ear utilizing a control. However, there is no monitoring of the noise over time to account for the cumulative effect. Furthermore, there is no accounting for any restorative effects within the ear for sound level exposures which are sufficiently low to allow recovery, rather than destruction.

Dosimeters, such as that described in U.S. published Application No. US2005/0254667 are known. The device periodically measures prior sound level in the ambient environment. However, the device does not take into account the cumulative effect of the noise over multiple incidences of exposure (e.g., one day to the next) or the effect of any restorative period. Furthermore, no remedial action is automatically taken as a result of the readings.

At least one exemplary embodiment of the invention is directed to measuring and determining the exposure of a vehicle occupant to sound over time. Reference is made to FIG. 1 in which a system, generally indicated as 100, is constructed in accordance with at least one exemplary embodiment of the invention. System 100 includes an audio input device 113 for receiving sound in a vehicle cabin detected by a Vehicle Cabin Microphone (VCM). As will be discussed below, audio input device 113 can include an analog audio input 11, 23 and a digital audio input 19. The audio input device 113 outputs an audio signal corresponding to the received sound. Analog output signals from analog audio inputs 11, 23 are converted to a digital signal by an analog-to-digital (A/D) converter 118 so that digital sound signals are input into an input level detector 120.

Input level detector 120 determines the sound pressure level of the sound received at audio input device 113. Input level detector 120 outputs a sound pressure level (SPL) signal, which approximates the sound pressure level as would be experienced by an occupant of the vehicle, such as the vehicle operator or a passenger. In one exemplary embodiment, this occupant SPL estimate is calculated by modifying a first SPL estimate (i.e. the SPL at the location of the vehicle cabin microphone VCM) with a filter that models the acoustic transfer function (or impulse response) from the VCM location to a location close to the vehicle occupant's ears (e.g. a location approximately where the center of their head would be). In one embodiment, for each vehicle occupant, a separate transfer function may exist, and therefore a separate listening fatigue calculation may exist for each vehicle occupant. In another embodiment, the filter to modify the signal from the VCM may be calculated at a single location in the vehicle cabin (which may be the location of the VCM, in which case the VCM SPL estimate would not be modified).

The modified level from input level detector 120 is input to a minimum-level threshold detector 122. Minimum level threshold detector 122 determines whether the sound pressure level as detected by input level detector 120 exceeds a minimum level threshold. As described below, the minimum level threshold can be the permissible sound level (PSL) (e.g., effective quiet level) of the individual, or some predetermined level substantially corresponding to a level which is ear damage neutral over time or a level of interest, such as 80 dB, because of its effect on the ear. Therefore, if the minimum level threshold is detected as being exceeded, a signal indicating a sound pressure level in excess of the minimum level threshold is output to a start timer 124, which triggers a digital timer system 126 to begin a clock. Conversely, if the input sound pressure level is detected as being below the minimum threshold, a signal indicating the sound pressure level is below the minimum level threshold Is output to a start timer 124, which triggers a digital timer system 126 to begin a clock of a restorative period. If the sound pressure level is at the minimum threshold (within a margin of error), no clock needs to be started because this is neutral to the desired effect. In a preferred embodiment, the clock signal is changed with every significant (more than 1 dB by way of example) change in sound pressure level to get an accurate profile of sound exposure over time.

Once the sound pressure level, as detected at input level detector 120, decreases to or is below the minimum threshold level, a stop timer signal is output from stop timer 128 to digital timer system 126 to stop the clock corresponding to exposure to the excessively intense level. Digital timer system 126 outputs a clock value corresponding to the time period at which the minimum level threshold was not met, or in the preferred embodiment, for each period corresponding to a discrete level change.

A data memory or learning history database 127 receives the clock value from digital timer system 126 as well as the actual input level detected at input level detector 120 and determines a listening history or sound pressure level exposure history. The sound pressure level exposure history is a record of the user's exposure to sound pressure levels over time. Because the effect of exposure is cumulative, it is important that the exposure history be maintained. The listening history, as discussed below, can include cabin SPL (or modified cabin SPL), listening duration data, time between listening sessions, absolute time, sound pressure level dose (SPL Dose) data, including any restorative sound level, number of acoustic transients and crest factor, as well as other data.

The sound pressure level exposure history or listening history includes both the listening habits history and the environmental or ambient noise exposure history. The environmental noise exposure history is the exposure of a user to environmental noise over time as a result of the auditory stimuli inherent to the environment where the user is present. This can be highway traffic, construction site, even the restorative effect of the quiet sound pressure levels, e.g., those typically encountered in a library, whereas, the listening habits history is associated for the purposes for this disclosure with user-directed auditory stimuli such as music, words, other noises, which a user intentionally encounters for a purpose such as communication, learning, and enjoyment. Therefore, database 127, as will be discussed below, stores the cumulative SPL exposure.

It should be noted that in at least one exemplary embodiment, minimum level threshold detector 122 also starts the timer 124 when the sound pressure level is below the predetermined level. In this way, the restorative effect of sound levels below PSL (e.g., effective quiet noise) is accumulated for determining overall exposure damage potential.

In effect, the only time that digital timer system 126 is not running is when the detected sound pressure level signal is at the minimum level threshold. A listening fatigue calculator 130 receives the input level signal from input level detector 120 and data from the data memory listening history 127, and determines whether listening fatigue or hearing damage is likely to occur as a result of further exposure. Hearing damage is the injury to the hearing mechanism including conductive and sensorineural decrement in hearing threshold levels. It can be either temporary or permanent so long as it is a result of the noise exposure that is above PSL (e.g., Effective Quiet). In other words, listening fatigue calculator 130 will output a signal when a threshold sound exposure, determined as a function of exposure time and sound pressure level, as discussed in greater detail below, is achieved. At that point, a listening fatigue signal is output.

In at least one exemplary embodiment, the signal from the listening fatigue calculator is utilized to prevent damage and encourages some action by the user when exposure levels are near damaging levels. Therefore, in one non-limiting example, a listening fatigue display 140 is provided for receiving the signal from the listening fatigue calculator and displaying to the user a prompt to discontinue exposure to the sound level from the damaging sound source or audio source.

In another non-limiting example, the signal from the listening fatigue calculator 130 is output to an audio warning source 132, which outputs an output audio warning to the user notifying the user that exposure to the sound source has reached critical levels.

Figure 2:
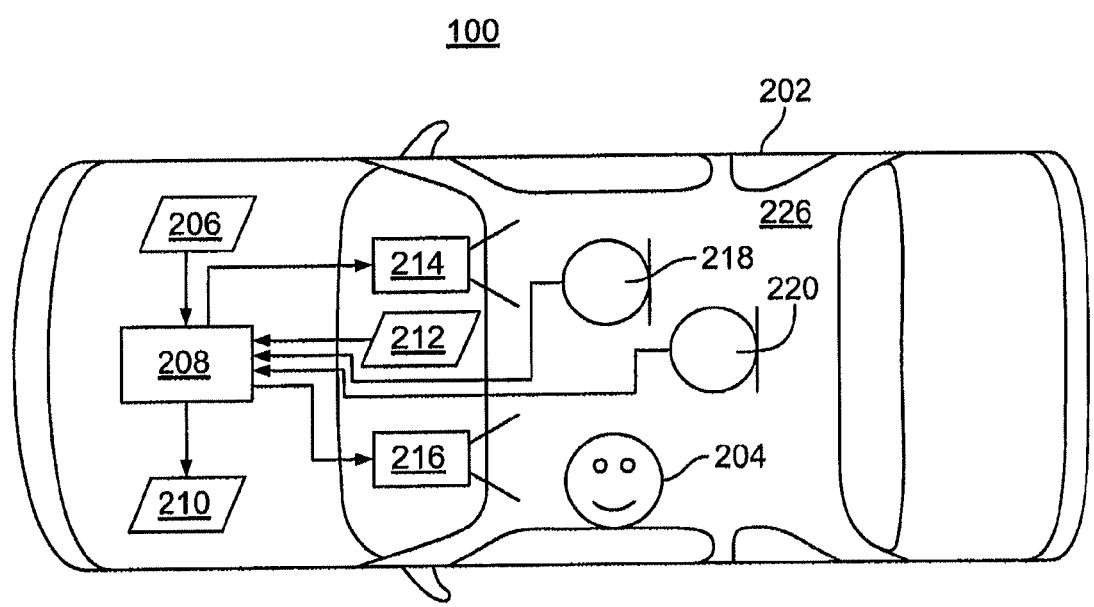
FIG. 2 is a block diagram of the system shown in FIG. 1 in accordance with at least one exemplary embodiment of the invention in a typical vehicle.

In at least one exemplary, but non-limiting, embodiment, as discussed below, system 100 includes at least one output acoustical transducer 25 to provide an audio signal to occupants of the vehicle. Output acoustical transducer 25 operates under the control of a digital signal processor (DSP) 134. Digital signal processor 134 receives a digital audio signal from input level detector 120, which acts as a pass through for the digitized signals from audio input device 113. Digital signal processor 134 passes the sound signals through to a digital to analog (D/A) converter 136 to drive acoustical transducers 25 to recreate the sound received at audio input device 113 inside the vehicle cabin in at least one exemplary embodiment of the invention as shown in FIG. 2. With such an exemplary embodiment, audio warning source 132 provides an output to digital sound processor 134 causing output acoustical transducer 25 to output a warning sound to the user.

Additionally, in at least one further exemplary embodiment, listening fatigue calculator 130 outputs a listening fatigue signal to digital processor 134 which causes digital signal processor 134 to attenuate the sound signal prior to being output to acoustical transducer 25 to reduce the signal output level by any of linear gain reduction, dynamic range reduction, a combination of both, or a complete shutdown of transducer 25. Attenuation would be at least to the level, if not below, the PSL (e.g., effective quiet level) to allow for ear recovery prior to damage.

It should be noted, that because personal hearing threshold and discomfort levels can change from person to person, and because both of the time intervals are a function of many variables, in a non-limiting example, to provide a dynamic ever-changing response, system 100 operates under software control. The configuration of the digital sound processor 134, listening fatigue calculator 130, the minimum level threshold detector 122, and the input level detector 120 are operated under software control.

In an exemplary embodiment of the invention, the control programs are stored in a program memory 148 for operating the firmware/hardware identified above. Furthermore, the program stored within memory 148 can be personalized as a result of testing of the user's hearing, or by other modeling methods, in which system 100 includes a software interface 144 for receiving online or remote source updates and configurations. The software interface 144 communicates with a data port interface 146 within system 100, which allows the input of software updates to program memory 148. The updates can be transmitted across a distributed communications network, such as the Internet, where the updates take the form of online updates and configurations 143.

Also note that when referring to measurements in decibels (dB), one is referring to a logarithmic ratio. For example dB is defined as:

$$SPL = \beta(dB) = 10\log\frac{I}{I_0} = 10\log\frac{\Delta P^2}{\Delta P_0^2}$$

where I is the intensity measured, $I_0$ is a reference intensity, $I_0=10^{-12}$ W/m$^2$, and $P_0$ is a reference pressure, $\Delta P_0=20$ micropascals, and where $\Delta P$ is the root mean squared pressure amplitude in a measured pressure wave (e.g., using a transducer). Thus, the sound pressure level (SPL) can be measured in dB.

Alternatively one can use the above equation and solve for measured pressures instead. For example:

$$\Delta P(t) = 10^{(SPL(t)/20.0)}\Delta P_0$$

In the discussion of formulas herein we refer to SPL as a non-limiting example and one of ordinary skill in the arts could re-derive the equations in terms of measured pressures, $\Delta P$, both are intended to lie within the scope of at least one exemplary embodiment.

Referring to FIG. 2, a block diagram of system 100 placed in vehicle 202 is shown. System 100 may include user interface 212, central audio processor system 208 (also referred to herein as processor 208), indicator 210, and at least one loudspeaker (for example, right loudspeaker 214 and left loudspeaker 216) (also referred to herein as a vehicle cabin receiver (VCR)) for directing sound into vehicle cabin 226 to vehicle operator 204 (or any occupant in vehicle cabin 226).

System 100 may also include one or more vehicle cabin microphones (VCMs) 218, 220 for capturing sound within vehicle cabin 226.

Processor 208 may be coupled to one or more of user interface 212, indicator 210, loudspeakers 214, 216, and VCMs 218, 220. Processor 208 may be configured to control acquisition of cabin sound signals from VCMs 218, 220. Processor 208 may be configured analyze cabin sound signals, to control operation of system 100 and to present information by system 100 to vehicle operator 204 (such as via loudspeakers 214, 216 and/or indicator 210) responsive to the analysis. Processor 208 may include, for example, a logic circuit, a digital signal processor or a microprocessor.

In operation, processor 208 may be configured to receive audio content (AC) signal 206 and reproduce AC signal 206 through loudspeakers 214, 216 into vehicle cabin 226. Processor 208 may also be configured to receive at least one cabin sound signal from VCMs 218, 220. Processor 208 may control operation of system 100 based on a determination of the cabin sound pressure level, based on AC signal 206 level and settings of loudspeakers 214, 216 and/or by at least one cabin sound signal.

AC signal 206 may include any audio signal provided to (and/or generated by) processor 208 that may be reproduced through loudspeakers 214, 216. AC signal 206 may correspond to (without being limited to) at least one of the following exemplary signals: a music or voice audio signal from a music audio source (for example, a radio, a portable media player, a computing device); voice audio (for example, from a telephone, a radio device or an occupant of vehicle 202); or an audio warning signal automatically generated by vehicle 202 (for example, in response to a backup proximity sensor, an unbelted passenger restraint, an engine malfunction condition, or other audio alert signals). AC signal 206 may be manually selected by vehicle operator 204 (for example, with user interface 212), or may be automatically generated by vehicle 202 (for example, by processor 208).

Although in FIG. 2, two loudspeakers 214, 216 are illustrated, system 100 may include more or fewer loudspeakers. For example, system 100 may include five loudspeakers (and a subwoofer) for 5.1 channel surround sound. It is understood that, in general, system 100 may include one or more loudspeakers.

User interface 212 may include any suitable user interface capable of providing parameters for one or more of processor 208, indicator 210, loudspeakers 214, 216 and VCMs 218, 220. User interface 212 may include, for example, one or more buttons, a pointing device, a keyboard and/or a display device.

Processor 208 may also issue alerts to vehicle operator 204, for example, via indicator 210. Indicator 210 may provide alerts via a visual indication, an auditory indication (such as a tonal alert) and/or a haptic indication. Indicator 210 may include any suitable indicator such as (without being limited to): a display (such as a heads-up display), a loudspeaker or a vibratory warning system (for example, mounted in the vehicle's steering wheel or operator seat).

System 100 may be coupled to a remote location (not shown), for example, by wireless communication. Information collected by system 100 may be provided to the remote location (such as for further analysis).

Processor 208 can determine the cabin sound pressure level by analyzing the signal level and signal gain reproduced with the cabin loudspeakers 214, 216, and the sensitivities of the cabin loudspeakers 214, 216.

Alternatively, at least one of VCMs 218, 220 is configured to determine a cabin sound pressure level. This would allow for consideration of other cabin sound sources (i.e. other than that contributed by the at least one cabin loudspeakers), such as air conditioning systems, and sound from vehicle passengers.

In the above description the operation of system 100 is driven by sound pressure level, i.e. sound levels are monitored for time periods or epochs during which the sound pressure level does not equal the minimum level threshold or is constant. However, as discussed in connection with the next exemplary embodiments of the invention, system 100 can also operate utilizing fixed or variable sampling epochs determined as a function of one or more of time and changes in sound pressure level, sound pressure dosage level, weighting functions to the sound pressure level, and restorative properties of the ear.

Figure 3:
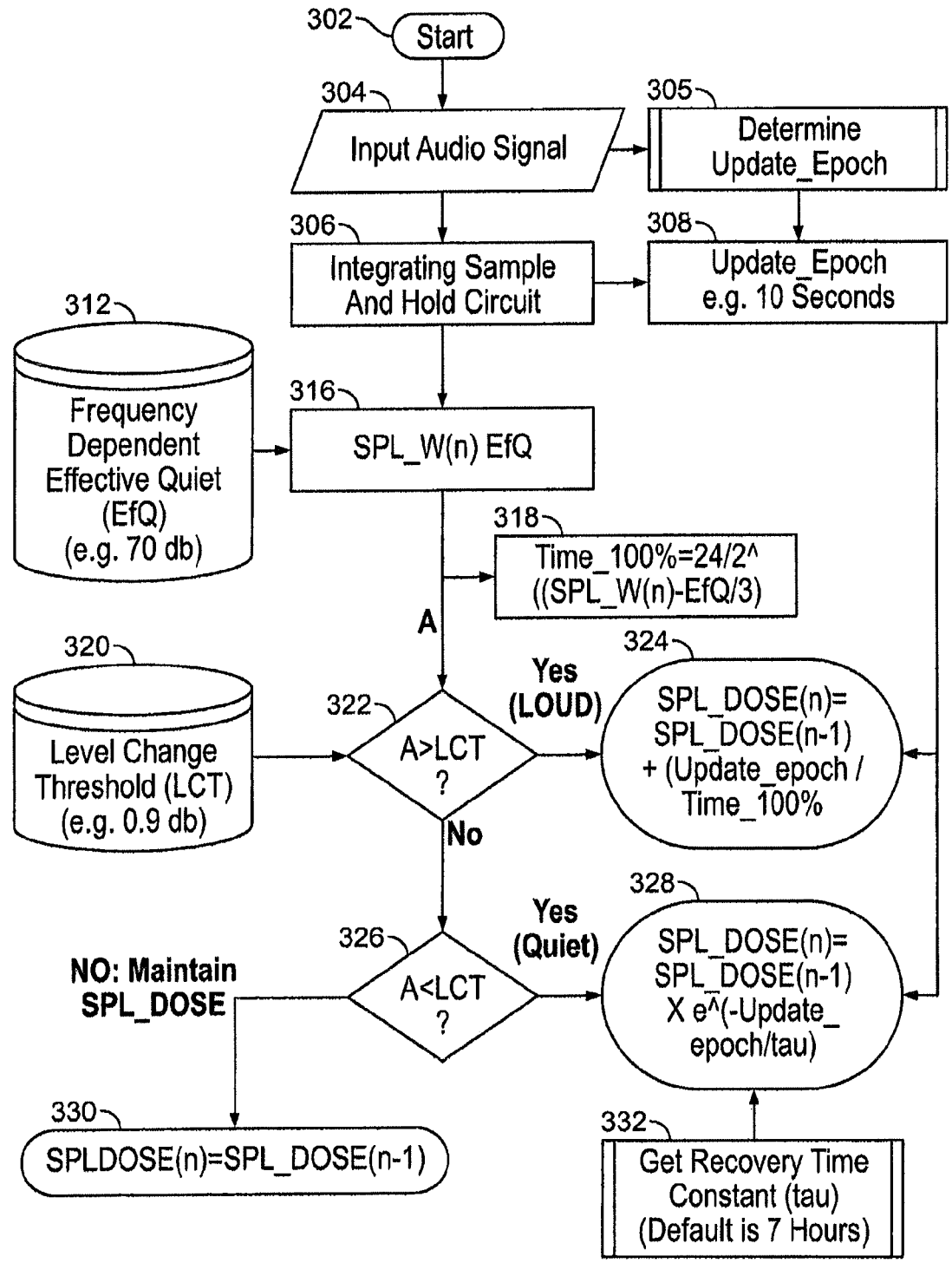
FIG. 3 is a flow chart for calculating listening fatigue in accordance with at least one embodiment of the invention by measuring a quantity (e.g., the sound pressure level) over time as would be perceived by the vehicle operator

Reference is now made to FIG. 3 in which a flow chart for monitoring the sound pressure level dose at various sample times n is provided. The process is started in a step 302. An input audio signal is generated in a step 304 by the at least one vehicle cabin microphone (VCM) 218, 220. Changes in SPL_Dose resulting from duration of exposure time is a function of the sound pressure level, therefore, the epoch or time period used to measure ear exposure or, more importantly, the time-period for sampling sound pressure level is determined in a step 305. In a step 306, the input audio signal is sampled, held and integrated over the duration of the epoch as determined in step 308. The update epoch 308 is used in the SPL Dose function determination as well as to effect the integration period for the sound pressure level calculation that, as will be discussed below, is used to calculate the weighted vehicle cabin sound pressure level.

In a step 308, the update epoch may be changed. The update epoch may be fixed or may be changed as a function of one or more of time and changes in sound pressure level, sound pressure dosage level, weighting functions to the sound pressure level, and restorative properties of the ear. An example of methods for changing the update epoch are described in US 2008/0144841 to Goldstein et al., the contents of which are incorporated herein.

Figure 4:
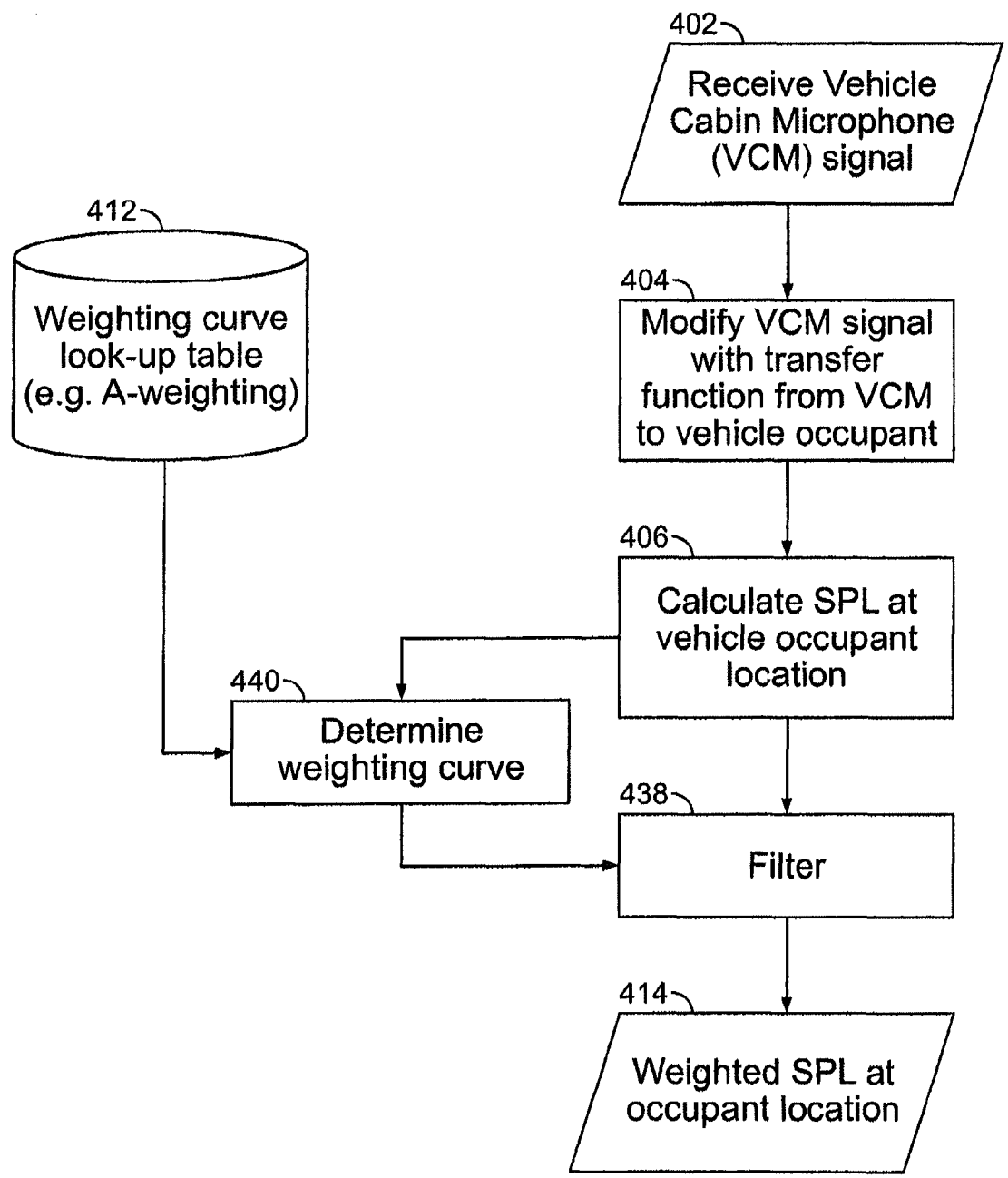
FIG. 4 is a flow chart for further processing an internal vehicle cabin microphone signal with a transfer function that maps internal cabin sound level to the sound level that would be experienced by a vehicle occupant (e.g. vehicle operator or passenger)

FIG. 4 is a flow chart for further processing an internal vehicle cabin microphone signal (received from step 306) with a transfer function that maps internal cabin sound level to the sound level that would be experienced by a vehicle occupant (e.g. vehicle operator or passenger).

At step 402, a vehicle cabin microphone (VCM) signal is received, for example from at least one of loudspeakers 214, 216 (FIG. 2). At step 404, the VCM signal is modified with a transfer function from the VCM to vehicle occupant. At step 406, the sound pressure level (SPL) at the vehicle occupant location is calculated, using the modified VCM signal.

A further weighting function can be applied to the modified VCM signal (determined at step 406). Weighting is done to compensate for the manner in which sound is perceived by the ear as a function of frequency and pressure level. As sounds increase in intensity, the ear perceived loudness of lower frequencies increases in a nonlinear fashion. By weighting, if the level of the sound of the field is low, the methodology and system utilized by at least one exemplary embodiment of the invention reduces the low frequency and high frequency sounds to better replicate the sound as perceived by the ear.

Specifically, a weighting curve lookup table, such as A-weighting, acts as a virtual band-pass filter for frequencies at sound pressure levels.

The input audio signal from at the at least one VCM 218, 220 (FIG. 2) (step 402) can be evaluated to determine an actual SPL at a given location in the vehicle cabin (e.g. the location of the vehicle operator's head).

However, in at least one exemplary embodiment, the sound pressure level is weighted to better emulate the sound as received at the ear. Therefore, in a step 412, a weighting curve lookup table is stored within system 100. In a step 440, the weighting curve is determined as a function of the actual sound pressure level as calculated or determined above in step 406 utilizing a weighting curve lookup table such as the A-weighting curve. The A-weighting curve is then applied as a filter in step 438 to the actual sound pressure level. A weighted sound pressure level value representative of a sampled time period (SPL_W(n)) is obtained to be utilized in a step 414.

The weighting curve can be determined in step 440 by applying a frequency domain multiplication of the sound pressure level vector and the weighting curve stored in step 412. In an exemplary embodiment the weighting curve may be appropriate for direct multiplication with the SPL in the frequency domain (i.e., SPL(f)). In another exemplary embodiment the weighted SPL can be expressed as a weighting of the measured pressure vector as:

$$\mathrm{SPL\_W}(n)(t) = 20\log\left(\frac{\Delta P^{W_A}(t)}{\Delta P_0}\right)$$

where $\Delta P(t)$ is the measured temporal change in root mean squared pressure, which can be converted into spectral space (e.g., by a fast Fourier transform (FFT)) as $\Delta P(f)$ which is the measured spectral change in pressure. The spectral change in pressure can in turn be multiplied by a weighting function (e.g., A-weighting), $W_A(f)$) and expressed as $\Delta P^{W_A}(f) = \Delta(f) \cdot W_A(f)-$, and then reconverted (e.g., inverse FFT) into temporal space to obtain $\Delta P^{W_A}(t)$. To obtain a single value various integration or summation over the n-th time interval (e.g., which can change in time) can be performed. For example:

$$\mathrm{SPL\_W}(n) = \frac{1}{\Delta t_n}\int_{t_{n-1}}^{t_n} 10\log\left(\frac{(\Delta P^{W_A}(t))^2}{\Delta P_0^2}\right) dt$$

The time during which a user may be exposed to the sound level SPL_W(n), i.e. the time to 100% allowable dosage at SPL level SPL_W(n), is referred to below as Time_100%(n).

The weighting curves 412 can be stored as a lookup table on computer memory, or can be calculated algorithmically. Alternatively, the input audio signal can be filtered with a time or frequency domain filter utilizing the weighting curve stored in step 412 and the sound pressure level as calculated. For low-level sound pressure levels, those less than 50 dB, by way of non-limiting example, a weighting curve, which attenuates low and high frequencies can be applied (similar to an A-weighting curve). For higher sound pressure levels, such as more than 80 dB, by way of a non-limiting example, the weighting curve can be substantially flat or a C-weighting curve.

The resulting weighted vehicle cabin sound pressure level during any respective sampling epoch is returned as the system output SPL_W(n). Note that herein various conventional weighting schemes are discussed (e.g., A-weighting, C-weighting) however in at least one exemplary embodiment non-conventional weighting schemes can be used. For example, generally dB is referenced to the threshold level of hearing sensitivity (threshold of detection), where 20 micro-pascals is typically used as the minimum threshold level of pressure variation that an average person can detect. This reference value tends to be used at all frequencies, although the threshold level varies with frequency.

Thus, one weighting scheme is to adjust the reference 0 dB level on a frequency basis, by using a conventional dB of threshold hearing chart, which provides the dB (f) at threshold level. A weighting function can be used where the value is about 1 at the reference value (e.g., equivalent to 20 micropascals) at a reference frequency (e.g., 1000 Hz). The other values (e.g., as a function of frequency) of the weighting function can varying depending upon the reference threshold pressure variation for the particular frequency, for example if at 30 Hz the threshold level in dB is 65 dB, then the weighting value can be ⅟65 at 30 Hz, de-emphasizing the loudness and/or intensity at 65 dB when SPL Dose (f) is calculated.

Returning to FIG. 3, a safe listening time is calculated by comparing the weighted sound pressure level with the PSL (e.g., effective quiet level) in step 316. Therefore, a value, A, corresponding to how far from safe listening the sound pressure level is, is determined by the equation:

$$A = \mathrm{SPL\_}W(n) - \mathrm{PSL}$$

where PSL is the permissible sound level, for example PSL=EfQ, where EfQ is equal to the sound level of effective quiet (as stored at step 312).

By utilizing this simple comparative function, fewer machinations and processes are needed. System 100 takes advantage of the fact that, because the PSL (e.g., effective quiet level) can be neutral to the ear, sound pressure levels significantly above the PSL (e.g., effective quiet level) are generally damaging and noise levels below the PSL (e.g., effective quiet) generally allow for restoration/recovery.

In a step 318, the remaining safe listening time at the beginning of any current sampling epoch can be calculated by Time_100% minus the time duration of exposure up to the current sampling epoch. Note that a negative number can occur, indicating that no safe listening time remains. The estimated time (e.g., in hours) until the individual's sound exposure is such that permanent threshold shift may occur, ignoring any previous sound exposure and assuming that the SPL of the sound field exposed to individual remains at a constant level L can be calculated as follows:

$$\mathrm{Time\_100\%}(n) = Tc/(2^{((\mathrm{SPL\_}W(n)-\mathrm{PSL})/\mathrm{ER})});$$

where PSL is the permissible sound level, and Tc is the critical time period. For example, if Tc (Critical Time) is 8 hours and PSL is 90 dBA, then that accepts that ~22-29% of people are at risk for hearing loss. If Tc is 8 hours and PSL is 85 dBA, then that accepts that ~7-15% of people are at risk, likewise for if Tc is 24 hours and PSL is 80 dBA, same 7-15% at risk. Thus Time_100%(n) reflects a reduction of the risk to a chosen level.

Note that Tc is the critical time period of exposure (e.g., 8 hours, 24 hours), and ER is the exchange rate, for example can be expressed as:

$$\mathrm{Time\_100\%}(n) = 8(\mathrm{hours})/(2^{((\mathrm{SPL\_}W(n)-85\ \mathrm{dBA})/3\ \mathrm{dB})})$$

These values assume a recovery period of 16 hours at a SPL level during that time of less than 75 dBA (where dBA refers to Decibels of an A-weighted value). Of course the realism of such an assumption is questionable given music, TV, and other listening habits of individuals. Thus, we are concerned with exposure over a 24 hour period. Thus, Time_100%(n) can be expressed for a 24 hour period (e.g., Tc=24 (hours)), where, for example using an equal energy assumption (i.e., ER of 3 dBA), as:

$$\mathrm{Time\_100\%}(n) = 24/(2^{((\mathrm{SPL\_}W(n)-\mathrm{PSL})/3)}).$$

Another further example is the situation where PSL=EfQ, where the Effective Quiet, EfQ is defined as the highest sound level that does not cause temporary or permanent hearing threshold shift, nor does it impede recovery from temporary hearing threshold shift. For broadband noise, it can be 76-78 dBA, although these numbers can be different or refined over time based upon research and/or measurement history.

As a non-limiting example, the lower bound of SPL_W(n) dictating the Time_100% equation would be SPL_W(n)=PSL, and the upper bound of the SPL_W(n) dictating Time_100% equation would be about SPL_W(n)=115 dB, for example.

In this embodiment, rather than make use of the Sound Level (L), the period is a function of the loudness and quietness of the weighted sound pressure level. It should be noted that PSL (e.g., effective quiet) is used in the above example, but any level of interest, such as 80 dB, or no sound level, i.e., SPL_W(n)=0, can be used. The weighted sound pressure level and PSL can be expressed as a frequency-dependent numerical array or a value scalar.

It is next determined whether or not the difference between the current weighted sound pressure level and the PSL (e.g., effective quiet) is above a tolerable threshold for risk of hearing damage or not, i.e., whether the weighted SPL in the eardrum is considered to increase risk for hearing damage or not. A sound pressure level dose is calculated depending upon whether the sound level is loud or not. The sound pressure level dose (SPL Dose) is the measurement, which indicates an individual's cumulative exposure to sound pressure levels over time. It accounts for exposure to direct inputs such as MP3 players, phones, radios and other acoustic electronic devices, as well as exposure to environmental or background noise, also referred to as ambient noise. The SPL Dose is expressed as a percentage of some maximum time-weighted average for sound pressure level exposure.

Because the sound pressure level dose is cumulative, there is no fixed time-period for ear fatigue or damage. At or below effective quiet, the sound pressure level exposure time would theoretically be infinite, while the time period for achieving the maximum allowable sound pressure level dose becomes smaller and smaller with exposure to increasingly more intense sound. A tolerable level change threshold corresponding to the amount of noise above or below the effective quiet which has no great effect on the ear as compared to effective quiet is determined and stored in memory 127 in a step 320. In a step 322, the differential between the weighted sound pressure level and the effective quiet is compared to the level change threshold.

A differential value A, corresponding to the level change, can be calculated as follows:

$$A = SPL\_W(n) - PSL$$

If A is greater than the level change threshold, the noise is considered to increase risk for hearing damage and the sound pressure level dose is calculated in a step 324 as follows:

$$SPL\ Dose(n) = SPL\ Dose(n-1) + (Update\_Epoch(n) / Time\_100\%)$$

where SPL Dose(n−1) is the SPL Dose calculated during the last epoch; Update_Epoch is the time (in hours) since the last SPL Dose was calculated. As described above, Update_Epoch can be adaptive, e.g., shortened when the sound pressure level is louder; and Time_100%(n), the time period remaining for safe exposure is determined by the equation:

$$Time\_100\%(n) = 24\ hours / (2^{((L-PSL)/3)})$$

where L=sound level (in dB) of the combination of environmental noise and audio playback. It should be noted that sound level (L) can be substituted for SPL_W(n).

It should be noted, as can be seen from the equation, that the time value becomes more important than the sound pressure level as updates are spread apart. However, this is to protect overexposure to harmful sounds because a less accurate sample size must account for the unknown. The wider the periodicity, the less accurate determination of actual exposure. Infrequent updates of the SPL Dose assume a relatively constant sound level, ignoring transients (e.g. spikes) and intervening restorative periods. Accordingly, sound pressure level and epoch periodicity are weighed against each other to protect the ear.

If, in step 322, it is determined that the differential is not greater than the level change threshold, including negative values for A (which are restorative values), then in step 326 it is determined whether or not the differential, as determined in step 316, is less than the level change threshold in a step 322. If it is determined that the differential is not less than the level change threshold, then the received noise was the effective quiet level, i.e., the level change threshold equals zero and in a step 330, the current SPL Dose is maintained at the same level. There is no change to the dose level. However, if the differential A is less than the level change threshold then this is a restorative quiet as determined in step 326.

Thus, if the differential A (e.g., A=SPL_W(n)−PSL) is less than zero, within measurement error, then this is considered a restorative quiet, then the n-th SPL dose is determined in step 328 as:

$$SPL\ Dose(n) = SPL\ Dose(n-1) * e^{(-Update\_epoch/\tau)}$$

where: τ (referred to as "tau" in the following diagrams) can vary (e.g., equal to about 7 hours). In some exemplary embodiments, tau is adaptive for different users. In at least one exemplary embodiment, the level change threshold (e.g., measurement error) is set at substantially 0.9-1.0 dB.

Note that other forms of a recovery function can be used and the description herein is not intended to limit the recover function to an exponential relationship. For example, during lower exposure times (e.g., 102 minutes) some SPL values (e.g., 95 dB) can be used, if the subsequent SPL is less than PSL, in a linear manner (for example linearly decreasing until there is a near zero threshold shift at 4000 Hz after one day from the time at which SPL<PSL).

Another non-limiting example of a recovery function can be a combination over certain exposure and decay periods (e.g., 7 day exposure at 90 dB, with an initial threshold shift after the 7 days of about 50 dB at 4000 Hz). For example a slow decaying linear relationship can be applied for the first few hours (e.g., 2 hours) where SPL<PSL, then an exponential decay from after the first few hours to a few days (e.g., 4 days) after which a leveling trend can occur.

Additionally although a fractional increase in SPL Dose is given as a non-limiting example, SPL Dose increase can be linear or exponential depending upon the exposure SPL level and the duration. For example the growth can be linear at certain SPL values (e.g., 95 dB) during different ranges of exposure time (e.g., for 95 dB, from about 4 minutes to 12 hours), then leveling out (e.g., threshold shift of about 59.5 dB) when the exposure time exceeds a certain length (e.g., for 95 dB about 12 hours).

In step 332, the recovery time constant tau is determined. It may not be a function of exposure, but rather of recovery. It can be a default number or be determined as will be discussed below. As the SPL Dose is calculated by system 100, it is also monitored. Once the SPL Dose reaches a certain level, as it is a cumulative calculation, ear fatigue calculator 130 determines whether the SPL Dose corresponds to a fatigued ear, and if so, it outputs warnings as discussed in connection with FIG. 1.

By providing a monitoring and protective system which, in at least one mode, continuously monitors sound pressure level in the vehicle cabin until a potentially harmful exposure has occurred, rather than only monitoring for a predetermined time as with noise dose monitors which monitor for work shifts, a more accurate predictor of harm to the user is provided. By utilizing a method, which determines exposure in part as a function of effective quiet exposure as well as intense noise exposure, an enhanced model of potential risk is achieved. By providing a series of warning mechanisms and preventive measures as a function of the determined potentially harmful dosage levels, ear damage is more likely to be prevented. By providing the system in a vehicle which makes use of audio inputs at the lateral and medial portions of the vehicle cabin, a more accurate reading of noise level is provided and more control through a real time warning system is achievable.

It should be known that values for level change threshold, effective quiet time, and epoch were used above as examples. However, it should be noted that any values which when input and utilized in accordance with the methodologies above prevent permanent damage to the ear are within the scope of the invention and the invention should not be so limited to the specific examples above.

Figure 5A:
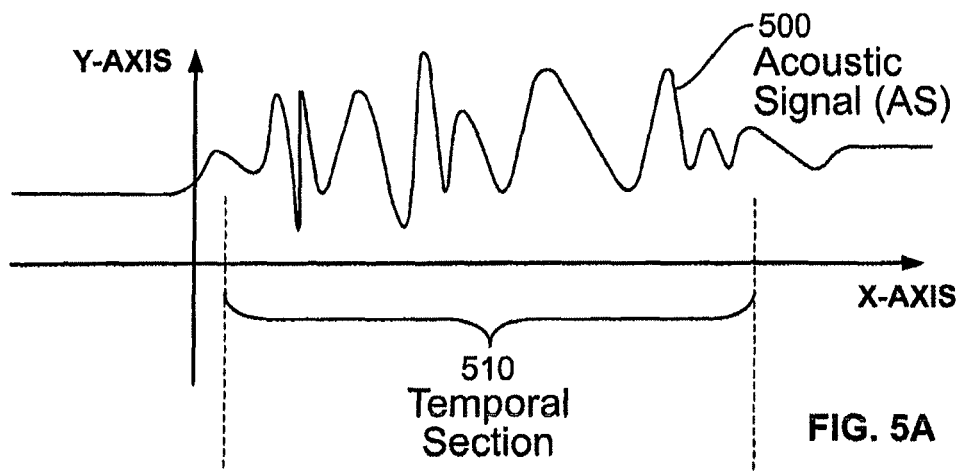
FIGS. 5A-5C illustrate an example of a temporal acoustic signal and its conversion into a spectral acoustic signature.
Figure 5B:
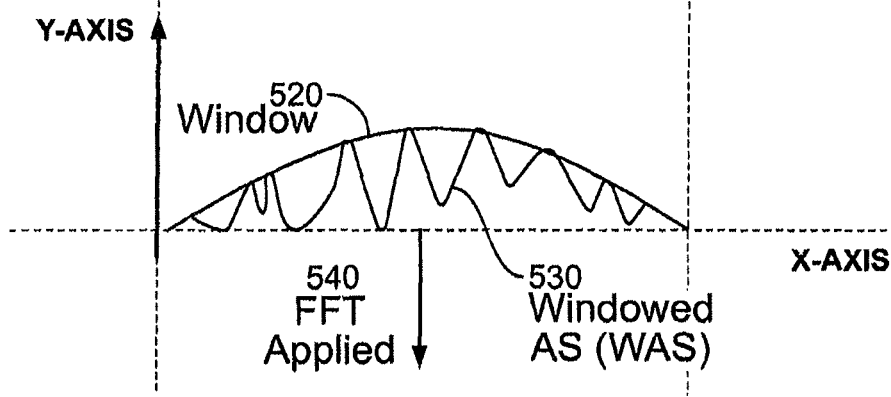
Figure 5C:
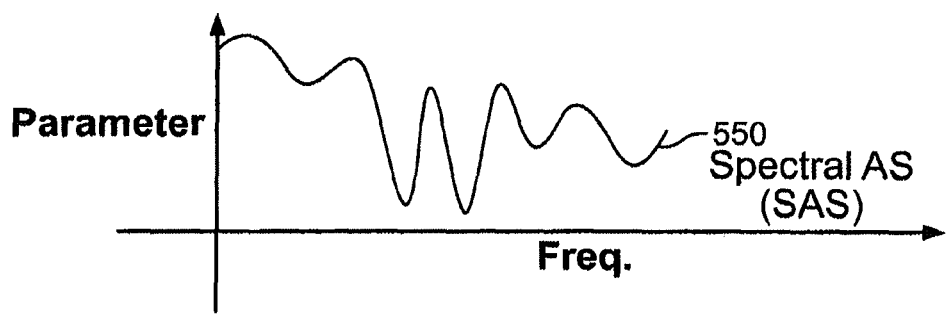

FIGS. 5A-5C illustrate an example of a temporal acoustic signal and its conversion into a spectral acoustic signature. FIG. 5A illustrates a temporal acoustic signal (AS) 500 on a generic X-Y coordinate system (e.g., Y can be amplitude in dB, and X can be time in sec). A section 510 of the AS 500 can be selected for further processing (e.g., for applying filtering treatments such as a FFT). For the non-limiting example of using a Fast Fourier Transform (FFT) on section 510, a window 520 can be applied to the section 510 to zero the ends of the data, creating a windowed acoustic signal (WAS) 530. An FFT can then be applied 540 to the WAS 530 to generate a spectral acoustic signal (SAS) 550, which is illustrated in FIG. 5C, where the Y-axis is a parameter (e.g., normalized power) and the X-axis if frequency (e.g., in Hz).

Figure 6A:
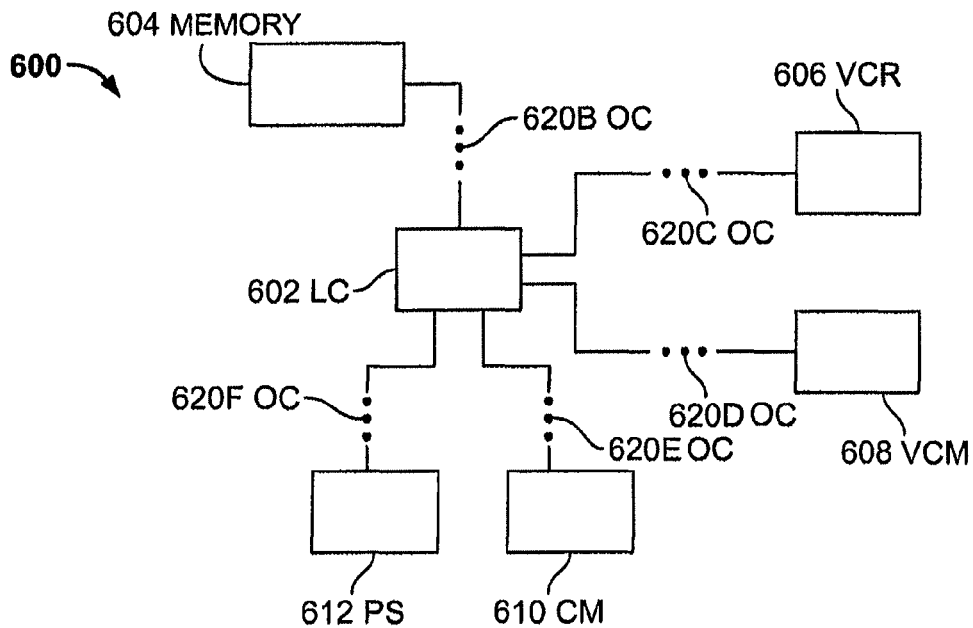
FIG. 6A illustrates a general configuration of some elements of a vehicle according to at least one exemplary embodiment.

FIG. 6A illustrates a general configuration of some elements either in or connected to a vehicle 600 (e.g., via a wired or wireless connection) according to at least one exemplary embodiment. Illustrated is a logic circuit (LC) 602 that is operatively connected (OC) 620B to a readable memory 604. LC 602 can store and read data on the readable memory 604 (e.g., RAM). LC 602 can also be operatively connected 620C to VCR 606, such that acoustic signals can be received by LC 602 from VCR 606 (e.g., in VCM mode if dual functional) and signals sent from LC 602 to VCR 606, where VCR 606 is configured to direct acoustic energy toward the user. LC 602 can also be operatively connected 620D to VCM 608, such that acoustic signals can be received by LC 602 from VCM 608. LC 602 can also be operatively connected 620E (e.g., via wire or wireless) to a communication module (CM) 610 (e.g., a Bluetooth® communication module). To power the various elements a power source (PS) 612 can also be operatively connected 620F to LC 602 and to any other element.

Figure 6B:
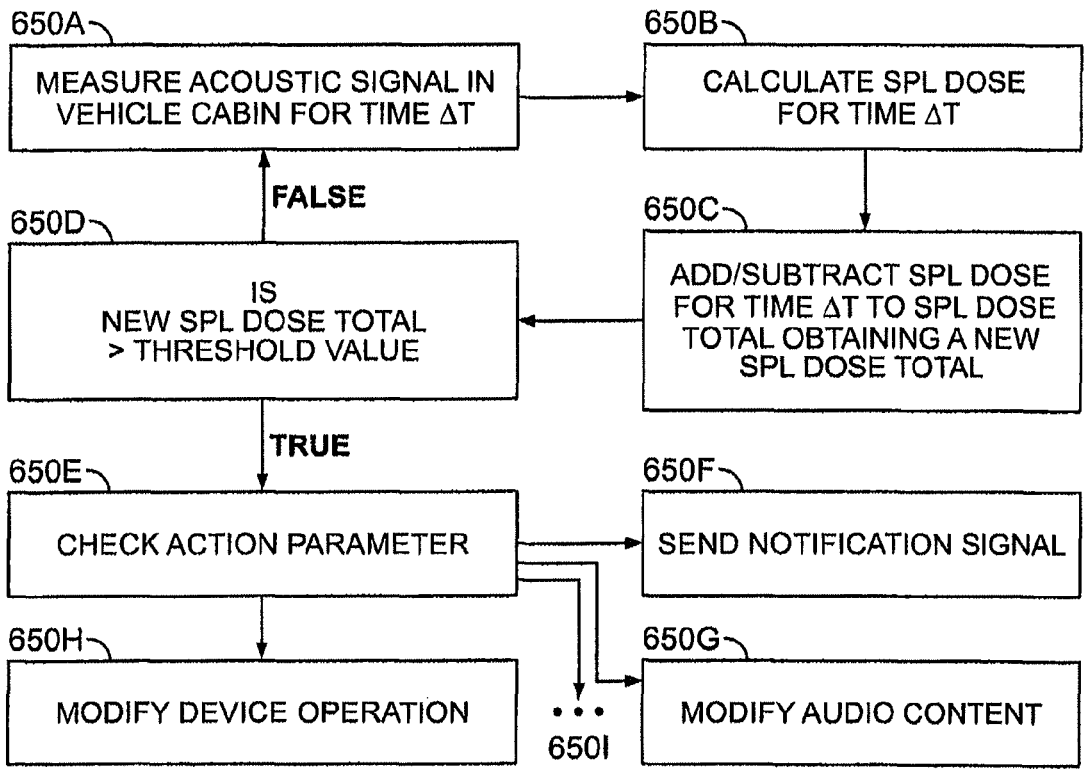
FIG. 6B illustrates a flow diagram of a method for SPL Dose calculation according to at least one exemplary embodiment.

FIG. 6B illustrates a flow diagram of a method for SPL Dose calculation according to at least one exemplary embodiment. A signal (e.g., intended audio playback content, or received voice from a phone) can be sent to LC 602 to be sent to the VCR 606. The signal can be converted to calculate the SPL(t) associated with the signal being sent to VCR 606. Alternatively an SPL can be measured from VCM 608. Thus the signal to the VCR can be measured, 650A. An SPL can be measured for a chosen period of time, and an SPL_Dose estimate calculated as described above, 650B. Alternatively, if measurements are made from a VCM 608, the SPL measured from the VCM 608 can be used to calculate the SPL Dose for the chosen period of time.

The SPL_Dose or SPL Dose estimate can be added/subtracted to/from a running SPL Dose total to obtain a new SPL Dose total 650C. The new SPL Dose total is compared to a threshold value, 650D, and if the threshold value is exceeded the LC 602 compares a check action parameter, which can be a user defined variable, to determine one or more actions to take, 650E.

For example if the action parameter is a certain value (e.g., 1) then the action can be to modify device operation 650H, for example to shut down the device after a period of time (e.g., 10 seconds). Alternatively or cumulatively, if the action parameter is another value (e.g., 2), a notification signal can be sent (e.g., acoustic notice, for example a musical score) 650F, and/or if the action parameter is still another value (e.g., 3) the audio content can be modified (e.g., SPL output by VCR s reduced), 650G. Note other actions can be included, 650I, for example the STL can be increased (e.g, active noise cancellation could be activated).

FIGS. 7A-7J illustrate an exemplary method of calculating a total SPL Dose, and modifying the SPL emitted by VCR 606 to modify the total SPL Dose so that a threshold value is not exceeded.

Figure 7A:
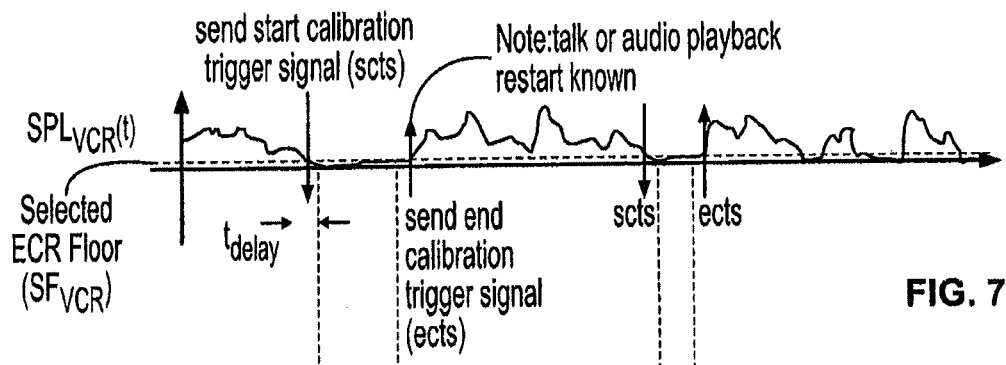
FIGS. 7A-7J illustrate charts of SPL doses for a method of calculating a total SPL Dose, and modifying the SPL emitted by a VCR to modify the total SPL Dose so that a threshold value is not exceeded.
Figure 7B:
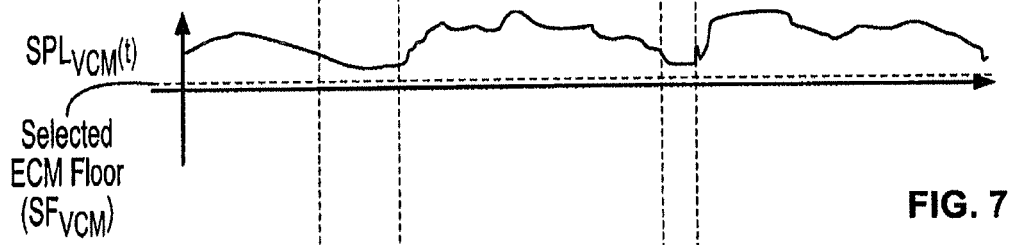
Figure 7C:
Figure 7D:

FIG. 7A illustrates the SPL generated by VCR 606 ($SPL_{VCR}$), which can be either estimated using the signal sent to the VCR 606, or by measurement by VCM 608, with the ambient SPL values removed. For example, in an environment where there is steady environmental noise which is then assumed and subtracted from any signal picked up by VCM 608 to get an SPL value from the VCR 606. Normally however one would estimate the SPL from VCR 606 from the signal being sent to VCR 606.

An example of SPL generated from VCR 606 is illustrated in FIG. 7A. Optionally a selected VCR floor value for the SPL generated from the VCR ($SF_{VCR}$) can be set (e.g., 45 dB). When $SPL_{VCR}$ drops below $SF_{VCR}$ one can either flip to the VCM mode of VCR 606 if it is a dual mode receiver to calibrate VCM 608, and/or measure the SPL by VCM 608 and calibrate the $SPL_{VCR}$ calculation.

What is illustrated in FIGS. 7A, 7C, 7D and 7E are some of the steps in calibrating the signals measured by VCM 608 using a dual mode VCR 606. For example when $SPL_{VCR}$ drops below $SF_{VCR}$ a calibration signal scts can be sent (FIG. 7A). There may be a time delay ($t_{delay}$) before a start of the VCM mode signal (e.g., $sts_{VCM}$) (FIG. 7C) can be sent to trigger the VCM mode of VCR 606. Likewise a signal (e.g., $sts_{VCR}$) (FIG. 7D) triggering a switch back to VCR mode can be sent at the end of the measurement period.

Figure 7E:
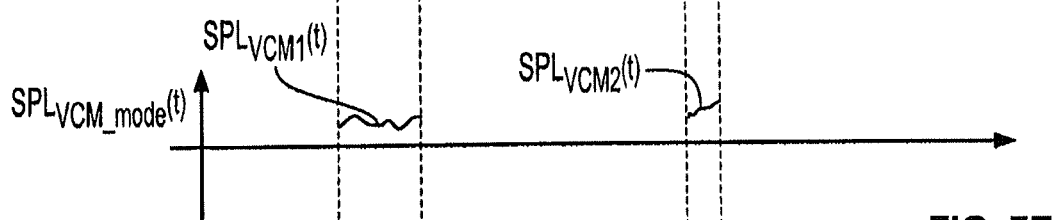
Figure 7F:
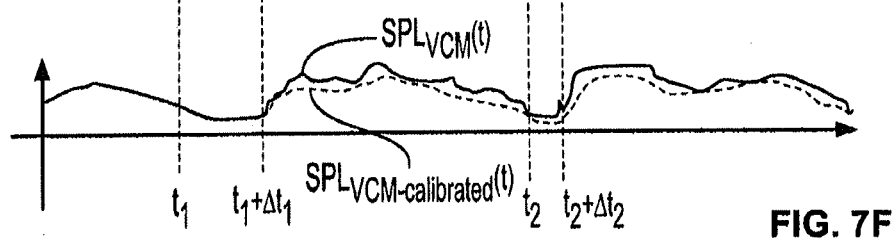

Note that the signal being sent to VCR 606 is known and thus one will know ahead of time when $SPL_{VCR}$ will rise above $SF_{VCR}$. While in VCM mode, VCR 606 can measure the environmental SPL, $SPL_{VCM1...N}$ (FIG. 7E). The values of $SPL_{VCM1...N}$ can be compared with $SPL_{VCM}(t)$ measured by VCM 608 and a calibration of VCM 608 can be obtained to improve the values measured. Note that this is an optional feature and in some cases the measurement error of a dual VCR/VCM mode VCR 606 might be larger than that of VCM 608, and thus it may be desirable not to use VCR 606 for calibration of VCM 608. FIG. 7F illustrates the case where $SPL_{VCM}(t)$ has been calibrated $SPL_{VCM\text{-}calibrated}(t)$.

Figure 7G:
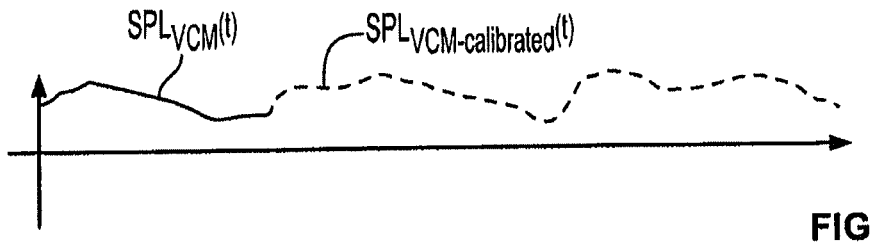
Figure 7H:
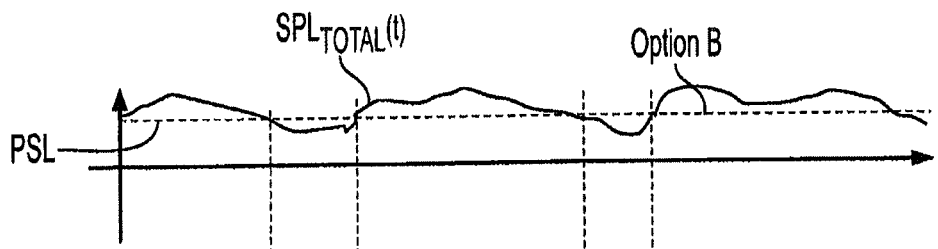
Figure 7I:
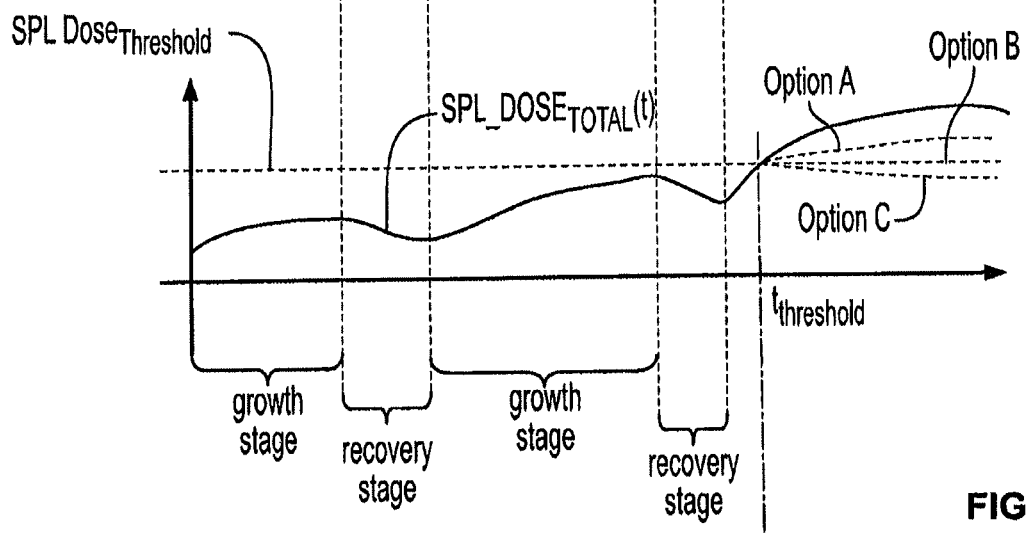

Thus $SPL_{total}(t)$ can be the values of $SPL_{VCM}(t)$ with the most confidence (e.g., minimal standard deviation), which can be a combination of calibrated and uncalibrated parts (FIG. 7G). $SPL_{total}(t)$ can be compared with a PSL and modified (e.g., option B, FIG. 7H) to be equal to or lie below PSL. A $SPL\_Dose_{total}(t)$ value can be calculated using $SPL_{total}(t)$, and compared to an $SPL\ Dose_{threshold}$ value (FIG. 7I).

Figure 7J:
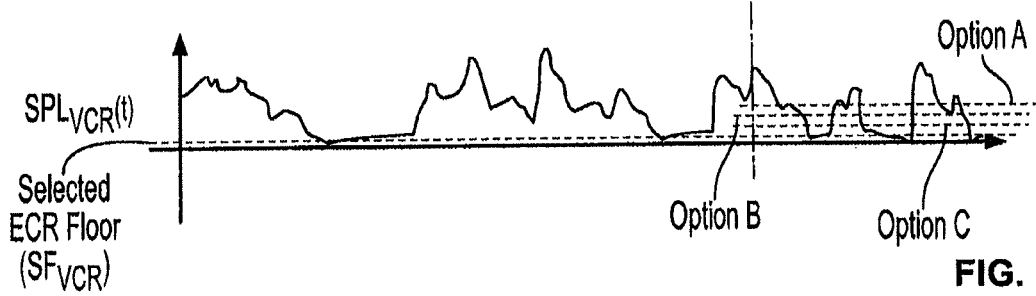

When $SPL\_Dose_{total}(t)$ is greater than the threshold value $SPL\ Dose_{threshold}$ then several actions can be taken. One action is notification of a user (audibly visually, or physically such as vibrating). Another action is to vary the $SPL_{total}$ value to adjust the $SPL\_Dose_{total}(t)$ value. This can be done by varying $SPL_{VCR}(t)$ and/or by varying other non-VCR generated SPL values (e.g., by increasing the effective STL). Varying SPL can affect SPL_Dose in various ways, for example a reduction of the increase of SPL Dose (option A), a stable SPL_Dose at the threshold level (option B) or a reduction of SPL Dose (option C) (FIGS. 7I and 7J).

There are multiple methods of modifying the SPL in the LC 602 (e.g., modifying the SPL emitted by the VCR 606, or increasing the effective STL). For example, an intensity of the audio content signal 206 (FIG. 2) (also referred to herein as a VCR signal) can be reduced and/or one or more frequencies in a spectral signature of the VCR signal may be reduced. Two non-limiting examples are provided below.

The VCR signal may be attenuated when the calculated SPL_Dose exceeds a certain threshold, where that threshold may be expressed as a percentage value. In an exemplary configuration, the attenuation level may be dependent on a difference between a threshold value and the SPL_Dose. When the SPL_Dose exceeds the threshold value, for example, the threshold value may be set to about 80%. The attenuation value may be about 3 dB for SPL_Dose values between about 80% to about 90%, and about 6 dB for SPL_Dose values above about 90%.

The VCR signal may be processed with a frequency dependent filter when the calculated SPL_Dose exceeds a certain threshold, where that threshold may be expressed as a percentage value. In an exemplary configuration, the frequency dependent filter may be selected dependent on a difference between a threshold value and the SPL_Dose, when the SPL_Dose exceeds the threshold value. For example, the threshold value may be set to 80%. A first frequency dependent filter may be selected for SPL_Dose values between about 80% and 90%, and a second frequency dependent filter may be selected for SPL_Dose values above about 90%.

Although the invention has been described in terms of systems and methods for operating an audio device in a vehicle, it is contemplated that one or more steps and/or components may be implemented in software for use with microprocessors/general purpose computers (not shown). In this embodiment, one or more of the functions of the various components and/or steps described above may be implemented in software that controls a computer. The software may be embodied in non-transitory tangible computer readable media (such as, by way of non-limiting example, a magnetic disk, optical disk, flash memory, hard drive, etc.) for execution by the computer.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating an audio device in a vehicle cabin comprising the steps of:
    directing an acoustic signal to at least one vehicle cabin receiver (VCR) of the audio device;
    measuring sound pressure levels ($SPL_{VCM}$) for acoustic energy received by at least one vehicle cabin microphone (VCM) of the audio device during a time period $\Delta t$;
    calculating, by one or more processors, a sound pressure level (SPL) dose ($SPL\_Dose_{\Delta t}$) during the time period $\Delta t$ using the sound pressure levels $SPL_{VCM}$ of the at least one VCM;
    combining, by the one or more processors, the SPL dose ($SPL\_Dose_{\Delta t}$) with an SPL dose of a previous time period to form a total SPL dose ($SPL\_Dose_{total}$);
    performing, by the one or more processors, an action to modify operation of the audio device when the total SPL dose is greater than a predetermined threshold, the action including at least one of sending a notification signal, setting a time after which the audio device shuts down or adjusting a system transmission loss (STL) of the audio device; and
    modifying the acoustic signal directed to the at least one VCR by at least reducing an amplitude of one frequency or less than all the frequencies in a spectral signature of the acoustic signal.

2. The method according to claim 1, wherein the modifying of the acoustic signal further includes reducing an intensity of the acoustic signal sent to the at least one VCR.

3. The method according to claim 1, wherein the modifying of the acoustic signal further includes modifying the acoustic signal to at least one of:
    reduce a rate of increase of the total SPL dose, or
    maintain a substantially stable SPL dose at the predetermined threshold.

4. The method according to claim 1, wherein the sending of the notification signal includes at least
    activating a vibratory warning system.

5. The method according to claim 1, the method further comprising:
    reading at least one action parameter associated with the action from a readable memory.

6. The method according to claim 1, the method further comprising:
    adjust a duration of the time period $\Delta t$ based on at least one of the sound pressure levels, a change in the sound pressure levels, the SPL dose or a recovery function of an ear of a user.

7. The method according to claim 1, the method further comprising:
    comparing the SPL dose ($SPL\_Dose_{\Delta t}$) to a permissible sound level, the permissible sound level associated with a neutral hearing damage level; and
    replacing the SPL dose ($SPL\_Dose_{\Delta t}$) with a recovery function associated with a restorative effect of sound pressure levels ($SPL_{VCM}$) when the SPL dose is less than the permissible sound level.

8. The method according to claim 7, wherein the time period $\Delta t$ is an n-th time period and the recovery function is calculated by:

$$SPL\_Dose_{\Delta t}(n) = SPL\ Dose(n-1) * e^{(-Update\_epoch/\tau)}$$

where $SPL\_Dose(n-1)$ is the previous total SPL Dose of the previous time period, $\tau$ is a time constant, and Update_epoch is a current time period for measuring the sound pressure levels.

9. The method according to claim 1, wherein the sound pressure levels are modified by an effective quiet level prior to calculating the SPL dose.

10. The method according to claim 1, the method further comprising:
modifying the sound pressure levels by a transfer function between the at least one VCM and an occupant position of the vehicle prior to calculating the SPL dose.

11. The method according to claim 1, wherein the sound pressure levels measured by the at least one VCM are modified to minimize background ambient SPL values of the vehicle cabin.

12. The method according to claim 1, the method further comprising:
calibrating the at least one VCM based on the acoustic signal directed to the at least one VCR.

13. The method according to claim 1, the method further comprising:
calculating a remaining duration time (Time__100%) for continuing operation of the at least one VCR based on the sound pressure levels ($SPL_{VCM}$).

14. The method according to claim 13, wherein the time period $\Delta t$ is an n-th time period, and
the SPL dose ($SPL\_Dose_{\Delta t}$) is calculated using:

$$SPL\_Dose_{\Delta t}=(\Delta t/\text{Time}\_100\%),$$

where Time__100% has the form:

$$\text{Time}\_100\%(n)=Tc/(2^{((SPL_{VCM}-PSL)/ER)}),$$

where PSL is a permissible sound level, Tc is a critical time period and ER is an exchange rate.

15. The method according to claim 14, wherein the total SPL dose ($SPL\_Dose_{total}$) is calculated by:

$$SPL\_Dose_{total}=SPL\_Dose(n-1)+SPL\_Dose_{\Delta t}(n),$$

where SPL_Dose(n−1) is the previous total SPL Dose of the previous time period.

16. An audio system for a vehicle cabin comprising:
at least one vehicle cabin receiver (VCR) configured to reproduce an acoustic signal in the vehicle cabin;
at least one vehicle cabin microphone (VCM) configured to measure sound pressure levels for acoustic energy in the vehicle cabin during a time period $\Delta t$; and
a processor coupled to the at least one VCR and the at least one VCM, the processor configured to:
calculate a sound pressure level (SPL) dose during the time period $\Delta t$ using the sound pressure levels of the at least one VCM,
combine the SPL dose with an SPL dose of a previous time period to form a total SPL dose,
perform an action to modify operation of the audio system when the total SPL dose is greater than a predetermined threshold by reducing an amplitude of one frequency or less than all the frequencies in a spectral signature of the acoustic signal and wherein the action further includes at least one of generating a notification signal, setting a timer after which the audio system shuts down or adjusting a system transmission loss (STL) of the audio system.

17. The audio system according to claim 16, further including a memory configured to store at least one action parameter associated with the action.

18. The audio system according to claim 16, wherein the processor is configured to modify the acoustic signal by at least one of:
applying a first frequency dependent filter or applying a first frequency dependent filter and a second frequency dependent filter.

19. The audio system according to claim 16, wherein the processor is further configured to modify the acoustic signal to at least one of: reduce a rate of increase of the total SPL dose, maintain a substantially stable SPL dose at the predetermined threshold or reduce the total SPL dose.

20. The audio system according to claim 16, further comprising an indicator coupled to the processor, the indicator configured to provide an indication of a notification signal in the vehicle cabin in response to the action.

21. The audio system according to claim 20, wherein the indicator includes at least a haptic indicator.

22. The audio system according to claim 16, wherein the audio system is configured to send the notification signal to a remote location.

23. The audio system according to claim 16, wherein the processor is configured to:
compare the SPL dose to a permissible sound level, the permissible sound level associated with a neutral hearing damage level, and
replace the SPL dose with a recovery function associated with a restorative effect of sound pressure levels when the SPL dose is less than the permissible sound level.

24. The audio system according to claim 16, wherein the processor is configured to modify the sound pressure levels by a transfer function between the at least one VCM and an occupant position of the vehicle prior to calculating the SPL dose.

25. The audio system according to claim 16, wherein the processor is configured to modify the sound pressure levels measured by the at least one VCM to minimize background ambient SPL values of the vehicle cabin.

* * * * *